(12) United States Patent
Zhang et al.

(10) Patent No.: US 10,373,899 B2
(45) Date of Patent: Aug. 6, 2019

(54) SEMICONDUCTOR MODULE USING LEAD FRAME FOR POWER AND CONTROL TERMINALS AND BOTH HAVING ASYMMETRIC OR INHOMOGENOUS CONFIGURATION

(71) Applicant: Mitsubishi Electric Corporation, Tokyo (JP)

(72) Inventors: Hongbo Zhang, Tokyo (JP); Shogo Shibata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/969,807

(22) Filed: May 3, 2018

(65) Prior Publication Data

US 2019/0198431 A1 Jun. 27, 2019

(30) Foreign Application Priority Data

Dec. 22, 2017 (JP) ................................ 2017-246383

(51) Int. Cl.
| | |
|---|---|
| *H01L 23/50* | (2006.01) |
| *H01L 23/495* | (2006.01) |
| *H01L 25/18* | (2006.01) |
| *H01L 23/367* | (2006.01) |
| *H01L 23/31* | (2006.01) |
| *H01L 29/16* | (2006.01) |
| *H01L 29/20* | (2006.01) |

(52) U.S. Cl.
CPC .... *H01L 23/49575* (2013.01); *H01L 23/3675* (2013.01); *H01L 23/49537* (2013.01); *H01L 23/49562* (2013.01); *H01L 25/18* (2013.01); *H01L 23/3107* (2013.01); *H01L 23/4952* (2013.01); *H01L 29/1602* (2013.01); *H01L 29/1608* (2013.01); *H01L 29/2003* (2013.01)

(58) Field of Classification Search
CPC ......... H01L 23/49575; H01L 23/49551; H01L 23/49544; H01L 23/49555; H01L 23/49541

See application file for complete search history.

(56) References Cited

U.S. PATENT DOCUMENTS

2014/0027891 A1* 1/2014 Kimura ............... H01L 23/3107
257/675

FOREIGN PATENT DOCUMENTS

JP S50-061770 U1 10/1948

* cited by examiner

*Primary Examiner* — Ermias T Woldegeorgis
(74) *Attorney, Agent, or Firm* — Studebaker & Brackett PC

(57) ABSTRACT

A semiconductor module includes: a semiconductor chip; a package sealing the semiconductor chip; and a plurality of terminals connected to the semiconductor chip and protruding from the package, wherein the plurality of terminals includes a plurality of first terminals arranged side by side at a first pitch, and a plurality of second terminals arranged side by side at a second pitch, each terminal has a base portion, a tip portion narrower than the base portion, and a connection portion connecting the base portion and the tip portion, the connection portions of the plurality of first terminals are right-angled, and the connection portions of the plurality of second terminals are arc-shaped.

16 Claims, 5 Drawing Sheets

BURR OCCURS

SEMICONDUCTOR MODULE USING LEAD FRAME FOR POWER AND CONTROL TERMINALS AND BOTH HAVING ASYMMETRIC OR INHOMOGENOUS CONFIGURATION

BACKGROUND OF THE INVENTION

Field

The present invention relates to a semiconductor module capable of making miniaturization of a module and enhancement of resistance to damage compatible with each other.

Background

In a semiconductor module using a lead frame, a tip portion of a terminal is configured to be narrower than a base portion of the terminal in order to ensure insertion performance of the terminal into a substrate, etc. Since stress is repetitively applied to a boundary portion between the narrow tip portion and the wide base portion due to the weight of the module itself, a radiation. fin, etc., the semiconductor module has a problem that the terminal is apt to be damaged when vibration occurs. For this problem, in order to enhance the resistance to damage, it has been proposed that the boundary portion between the tip portion and the base portion be configured to be arc-shaped (see FIGS. 3 and 4 of Japanese Utility Model Laid-Open No. S50-61770, for example).

SUMMARY

In a power module having control terminals and power terminals as terminals, the number, pitch, width, etc. of both the terminals are asymmetric, inhomogeneous, etc. Accordingly, when the boundary portions of all the terminals are configured to be arc-shaped, the pitch must be increased to ensure an insulation distance between the terminals for even control terminals having a short pitch. As a result, there has been a problem that miniaturization of the module is inhibited.

The present invention has been implemented to solve the foregoing problem, and has an object to provide a semiconductor module capable of making miniaturization of a module and enhancement of resistance to damage compatible with each other.

A semiconductor module according to the present invention includes: a semiconductor chip; a package sealing the semiconductor chip; and a plurality of terminals connected to the semiconductor chip and protruding from the package, wherein the plurality of terminals includes a plurality of first terminals arranged side by side at a first pitch, and a plurality of second terminals arranged side by side at a second pitch, each terminal has a base portion, a tip portion narrower than the base portion, and a connection portion connecting the base portion and the tip portion, the connection portions of the plurality of first terminals are right-angled, and the connection portions of the plurality of second terminals are arc-shaped.

In the present invention, the connection portions of the plurality of first terminals having small pitch are right-angled, and the connection portions of the plurality of second terminals having large pitch are arc-shaped. As a result, miniaturization of the module and enhancement of the resistance to damage of the terminals are made compatible with each other.

Other and further objects, features and advantages of the invention will appear more fully from the following description.

DESCRIPTION OF EMBODIMENTS

Figure 1:
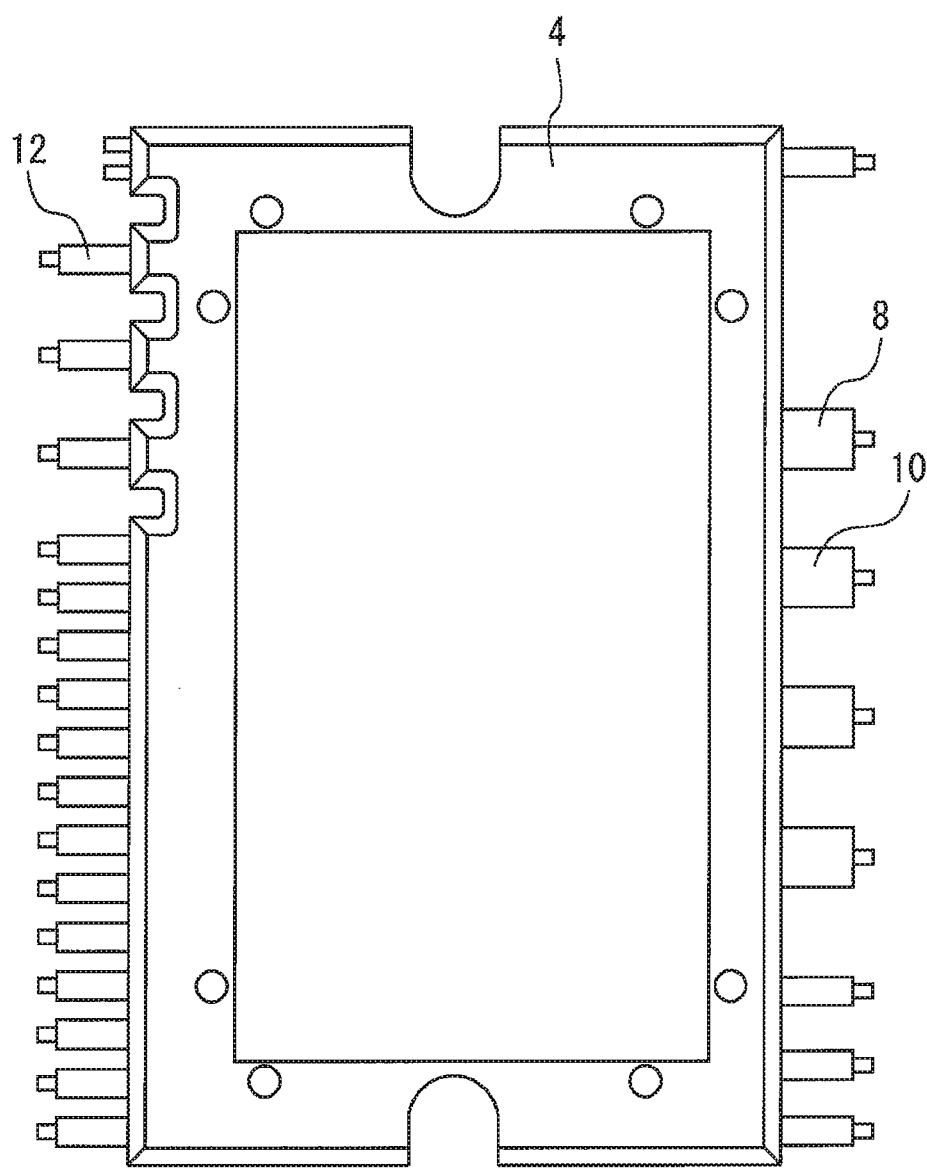
FIG. 1 is a plan view illustrating a semiconductor module according to an embodiment.
Figure 2:
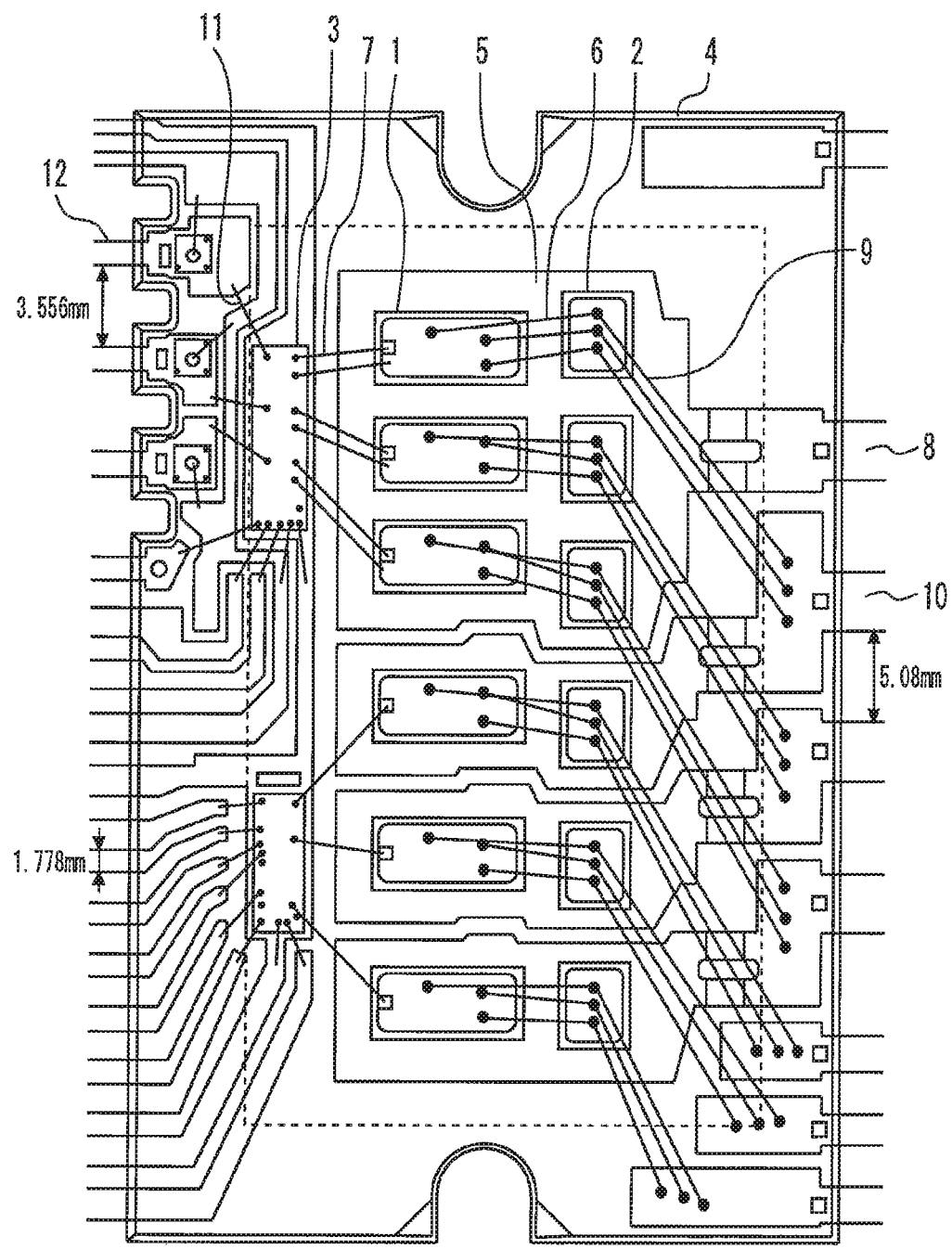
FIG. 2 is a plan view illustrating an internal configuration of the semiconductor module according to the embodiment.

FIG. 1 is a plan view illustrating a semiconductor module according to an embodiment. FIG. 2 is a plan view illustrating an internal configuration of the semiconductor module according to the embodiment. Semiconductor chips 1, 2 and 3 are sealed by a package 4 formed of mold resin or the like. The semiconductor chip 1 is a transistor such as IGBT or MOSFET. The semiconductor chip 2 is a diode. The semiconductor chip 3 is a control chip for controlling the semiconductor chip 1.

The semiconductor chips 1 and 2 are mounted on a lead frame 5, and lower electrodes of both the semiconductor chips 1 and 2 are connected to each other via the lead frame 5. Upper electrodes of the semiconductor chips 1 and 2 are connected to each other via a wire 6. The semiconductor chip 3 is connected to a control electrode of the semiconductor chip 1 via a wire 7. The lead frame 5 is connected to a power terminal 8. The upper electrode of the semiconductor chip 2 is connected to a power terminal 10 via a wire 9. The semiconductor chip 3 is connected to a control terminal 12 via a wire 11. As described above, the power terminals 8, 10 and the control terminals 12 are connected to the semiconductor chips 1, 2 and 3, and protrude from the package 4.

The control terminals 12 are arranged side by side at a pitch of 1.778 mm or 3.556 mm. The power terminals 8 and 10 are arranged side by side at a pitch of 5.08 mm which is larger than the pitch of the control terminals 12.

Figure 3:
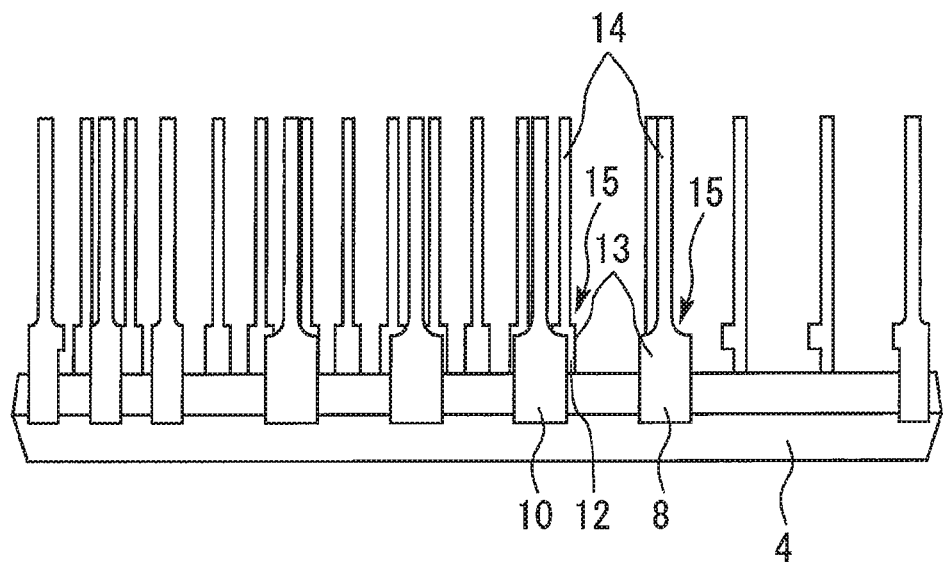
FIG. 3 is a side view illustrating the semiconductor module according to the embodiment.

FIG. 3 is a side view illustrating the semiconductor module according to the embodiment. Each of the power terminals 8, 10 and the control terminals 12 has a base portion 13 protruding from the package 4, a tip portion 14 narrower than the base portion 13, and a connection portion 15 connecting the base portion 13 and the tip portion 14. The pitch of the control terminals 12 is small while the number thereof is large, and stress to be applied per terminal under occurrence of vibration is small, so that occurrence of damage hardly appears. Therefore, the control terminals 12 are configured to be right-angled to prioritize minimization of the terminal pitch. On the other hand, the power terminals 8 and 10 to which high voltages are applied are configured to have large pitches in order to ensure the insulation distance. Accordingly, with respect to the power terminals 8 and 10, stress to be applied per terminal is large, and damage is apt to occur. Therefore, the connection portions 15 of the power terminals 8 and 10 are configured to be arc-shaped. As a result, miniaturization of the module and enhancement of the resistance to damage of the terminals are made compatible with each other.

Figure 4:
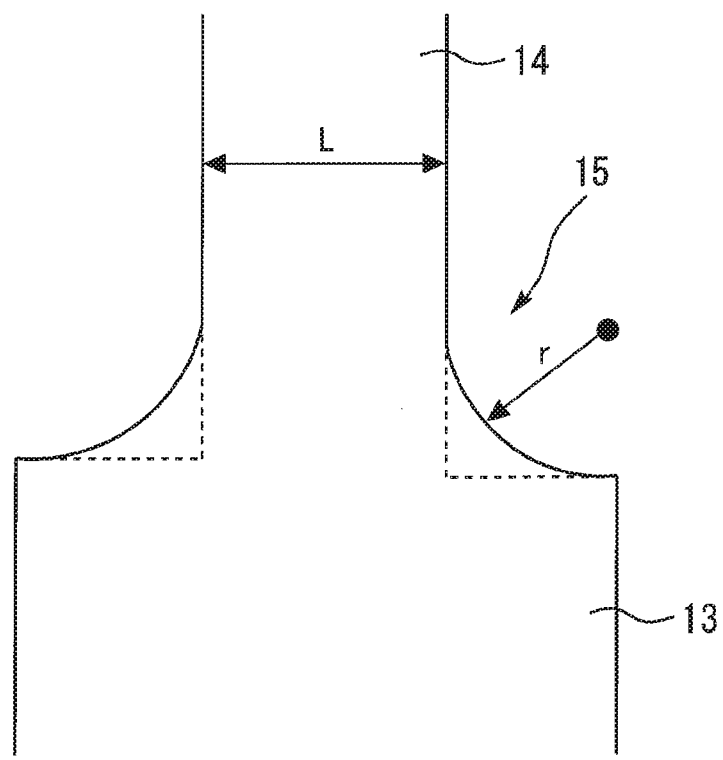
FIG. 4 is an enlarged view of the power terminal.

FIG. 4 is an enlarged view of the power terminal. Stress caused by vibration or the like is more liable to concentrate on corner portions as the radius r of the arc of the connection portions 15 of the power terminals 8 and 10 becomes smaller. Therefore, it is preferable that the radius r be larger. However, when the radius r exceeds a certain value, the effect of relaxing the stress concentration tends to reach its practical limit. Therefore, it is preferable that the relationship between the radius r of the arc and the width L of the tip portions 14 of the power terminals 8 and 10 satisfy $r/L \geq 1/3$.

Figure 5:
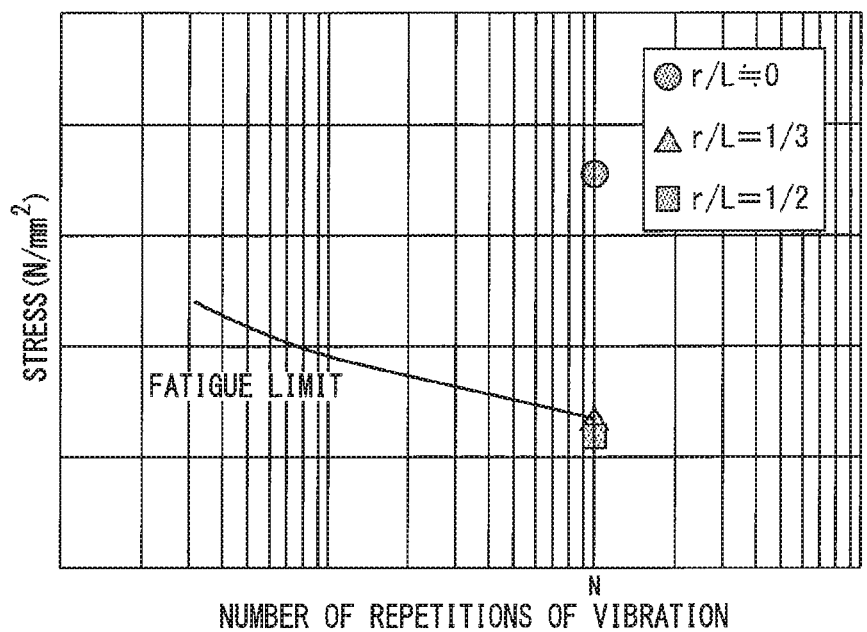
FIG. 5 is a diagram illustrating a simulation result of the relationship between the number of repetitions of vibration and the stress applied to the connection portion of the power terminal.

FIG. 5 is a diagram illustrating a simulation result of the relationship between the number of repetitions of vibration and the stress applied to the connection portion of the power terminal. It is apparent that $r/L \geq 1/3$ is required to be satisfied so that the stress applied to the connection portions 15 of the power terminals 8 and 10 at the maximum number N of repetitions of vibration expected in the semiconductor module falls below a fatigue limit.

Figure 6:
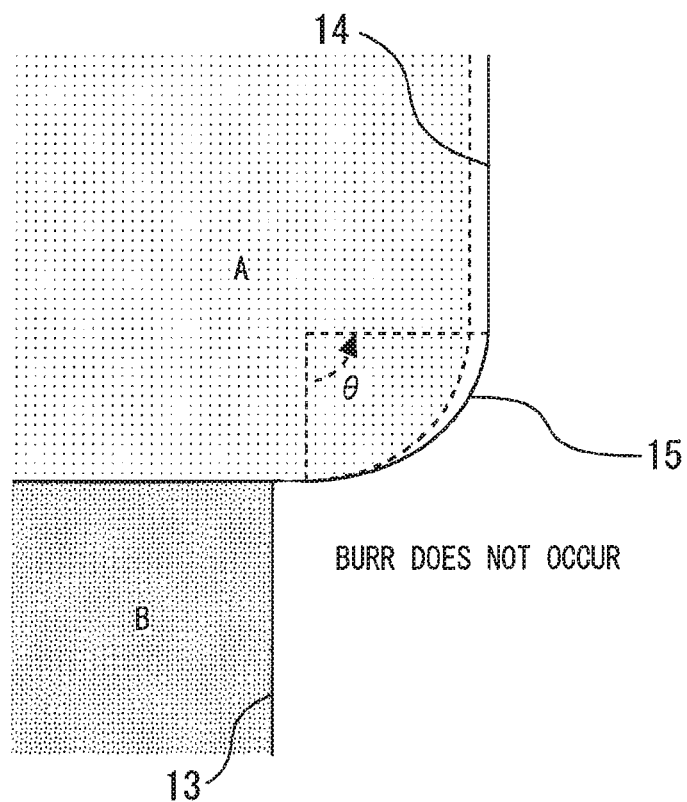
FIGS. 6 and 7 are diagrams illustrating a punching step for forming an arc at the connection portion of the power terminal.
Figure 7:
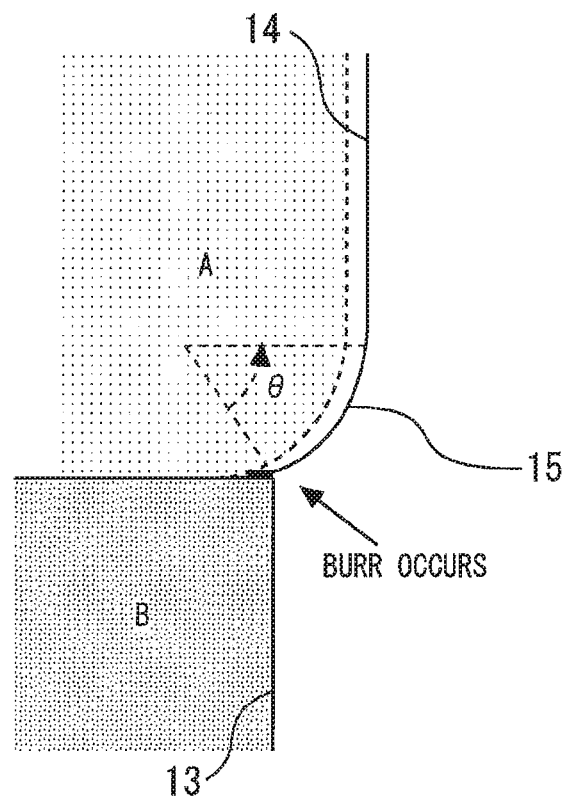

FIGS. 6 and 7 are diagrams illustrating a punching step for forming an arc at the connection portion of the power terminal. FIG. 6 illustrates a case where the angle θ of the arc of the connection portion of the power terminal is not less than 90°, and FIG. 7 illustrates a case where θ is less than 90°. Arcs are formed in the connection portions 15 of the power terminals 8 and 10 by the punching step using two punches A and B. However, as indicated by broken lines in FIGS. 6 and 7, a displacement occurs at a processed surface due to abrasion of the punches. When a displacement occurs at the processed surface in the case of θ smaller than 90°, metal burr occurs at the protrusion portion of the connection portion 15, which may cause insufficiency of the insulation distance between the terminals or short-circuiting between the terminals. On the other hand, in the case of θ equal to or larger than 90°, no burr occurs even when the positions of the punches vary somewhat. Accordingly, it is preferable that the angle θ of the arc of the connection portions 15 of the power terminals 8 and 10 be not less than 90°.

Figure 8:
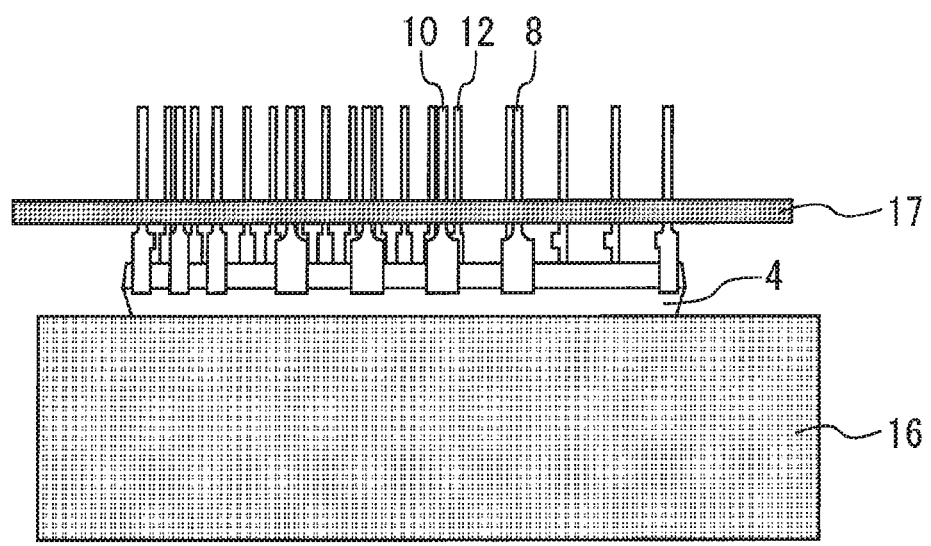
FIG. 8 is a side view illustrating an inverter system according to the embodiment.

FIG. 8 is a side view illustrating an inverter system according to the embodiment. A radiation fin 16 is fitted to the lower surface of the package 4. The narrow tip portions 14 of the terminals 8, 10 and 12 penetrate through the substrate 17, whereby the substrate 17 is fitted to the plurality of terminals 8, 10 and 12. The radiation fin 16 radiates heat occurring in the semiconductor chips 1, 2 and 3, and the substrate 17 controls the semiconductor chips 1, 2 and 3. According to this embodiment, the mechanical reliability of the inverter system can be enhanced by enhancing the resistance of the power terminals 8 and 10 to damage caused by the weights of the radiation fin 16 and the substrate 17.

The semiconductor chips 1 and 2 are not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor module in which the semiconductor chip is incorporated. Further, since the semiconductor chip has a high heat resistance, a radiation fin of a heatsink can be miniaturized and a water-cooled part can be air-cooled, which leads to further miniaturization of the semiconductor module. Further, since the semiconductor chip has a low power loss and a high efficiency, a highly efficient semiconductor module can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-246383, filed on Dec. 22, 2017 including specification, claims, drawings and summary, on which the Convention priority of the present application is based, is incorporated herein by reference in its entirety.

The invention claimed is:

1. A semiconductor module comprising:
   a semiconductor chip;
   a package sealing the semiconductor chip; and
   a plurality of terminals connected to the semiconductor chip and protruding from the package,
   wherein the plurality of terminals includes a plurality of first terminals arranged side by side at a first pitch, and a plurality of second terminals arranged side by side at a second pitch,
   each terminal has a base portion, a tip portion narrower than the base portion, and a connection portion connecting the base portion and the tip portion,
   the connection portions of the plurality of first terminals are right-angled, and
   the connection portions of the plurality of second terminals are arc-shaped.

2. The semiconductor module according to claim 1, wherein a relationship between a radius r of the arc and a width L of the tip portion of the second terminal satisfy $r/L \geq 1/3$.

3. The semiconductor module according to claim 2, wherein an angle of the arc of the connection portion of the second terminals is not less than 90°.

4. The semiconductor module according to claim 3, further comprising:
   a radiation fin fitted to the package; and
   a substrate fitted to the plurality of terminals.

5. The semiconductor module according to claim 4, wherein the semiconductor chip is made of a wide-band-gap semiconductor.

6. The semiconductor module according to claim 3, wherein the semiconductor chip is made of a wide-band-gap semiconductor.

7. The semiconductor module according to claim 2, further comprising:
   a radiation fin fitted to the package; and
   a substrate fitted to the plurality of terminals.

8. The semiconductor module according to claim 7, wherein the semiconductor chip is made of a wide-band-gap semiconductor.

9. The semiconductor module according to claim 2, wherein the semiconductor chip is made of a wide-band-gap semiconductor.

10. The semiconductor module according to claim 1, wherein an angle of the arc of the connection portion of the second terminals is not less than 90°.

11. The semiconductor module according to claim 10, further comprising:

a radiation fin fitted to the package; and
a substrate fitted to the plurality of terminals.

12. The semiconductor module according to claim 11, wherein the semiconductor chip is made of a wide-band-gap semiconductor.

13. The semiconductor module according to claim 10, wherein the semiconductor chip is made of a wide-band-gap semiconductor.

14. The semiconductor module according to claim 1, further comprising:
a radiation fin fitted to the package; and
a substrate fitted to the plurality of terminals.

15. The semiconductor module according to claim 14, wherein the semiconductor chip is made of a wide-band-gap semiconductor.

16. The semiconductor module according to claim 1, wherein the semiconductor chip is made of a wide-band-gap semiconductor.

\* \* \* \* \*